(12) United States Patent
Yamazaki et al.

(10) Patent No.: US 7,863,541 B2
(45) Date of Patent: Jan. 4, 2011

(54) LASER ANNEALING APPARATUS AND SEMICONDUCTOR DEVICE MANUFACTURING METHOD

(75) Inventors: Shunpei Yamazaki, Tokyo (JP); Koichiro Tanaka, Kanagawa (JP); Masaaki Hiroki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 76 days.

(21) Appl. No.: 10/944,000

(22) Filed: Sep. 20, 2004

(65) Prior Publication Data
US 2005/0035095 A1 Feb. 17, 2005

Related U.S. Application Data

(62) Division of application No. 10/212,773, filed on Aug. 7, 2002, now Pat. No. 6,847,006.

(30) Foreign Application Priority Data
Aug. 10, 2001 (JP) .............................. 2001-245095

(51) Int. Cl.
*B23K 26/00* (2006.01)
(52) U.S. Cl. .............................. 219/121.65; 219/121.78; 219/121.8
(58) Field of Classification Search ............ 219/121.76, 219/121.8, 121.85, 121.78, 121.65; 438/487
See application file for complete search history.

(56) References Cited

U.S. PATENT DOCUMENTS

| 3,585,088 A | | 6/1971 | Schwuttke et al. | |
| 4,330,363 A | | 5/1982 | Biegesen et al. | |
| 4,415,794 A | * | 11/1983 | Delfino et al. | 219/121.85 |
| 4,755,015 A | * | 7/1988 | Uno et al. | 385/131 |
| 4,806,728 A | * | 2/1989 | Salzer et al. | 219/121.63 |
| 5,108,843 A | * | 4/1992 | Ohtaka et al. | 428/446 |
| 5,208,187 A | * | 5/1993 | Tsubouchi et al. | 438/607 |

(Continued)

FOREIGN PATENT DOCUMENTS

JP    62-039138    2/1987

(Continued)

OTHER PUBLICATIONS

Office Action (Application No. 200610115609.9; CN5901D1) Dated Apr. 3, 2009.

*Primary Examiner*—M. Alexandra Elve
(74) *Attorney, Agent, or Firm*—Nixon Peabody LLP; Jeffrey L. Costellia

(57) ABSTRACT

This invention is intended to provide a laser annealing method by employing a laser annealer lower in running cost so as to deal with a large-sized substrate, for preventing or decreasing the generation of a concentric pattern and to provide a semiconductor device manufacturing method including a step using the laser annealing method. While moving a substrate at a constant rate between 20 and 200 cm/s, a laser beam is radiated aslant to a semiconductor film on a surface of the semiconductor substrate. Therefore, it is possible to radiate a uniform laser beam to even a semiconductor film on a large-sized substrate and to thereby manufacture a semiconductor device for which the generation of a concentric pattern is prevented or decreased. By condensing a plurality of laser beams into one flux, it is possible to prevent or decrease the generation of a concentric pattern and to thereby improve the reliability of the semiconductor device.

36 Claims, 13 Drawing Sheets

U.S. PATENT DOCUMENTS

| | | | |
|---|---|---|---|
| 5,308,998 A | 5/1994 | Yamazaki et al. | |
| 5,521,107 A | 5/1996 | Yamazaki et al. | |
| 5,561,081 A | 10/1996 | Takenouchi et al. | |
| 5,591,668 A | 1/1997 | Maegawa et al. | |
| 5,612,251 A * | 3/1997 | Lee | 438/795 |
| 5,624,585 A * | 4/1997 | Haruta et al. | 219/121.63 |
| 5,643,826 A | 7/1997 | Ohtani et al. | |
| 5,712,191 A | 1/1998 | Nakajima et al. | |
| 5,854,803 A | 12/1998 | Yamazaki et al. | |
| 5,858,822 A * | 1/1999 | Yamazaki et al. | 438/166 |
| 5,913,112 A | 6/1999 | Yamazaki et al. | |
| 5,923,962 A | 7/1999 | Ohtani et al. | |
| 5,937,282 A | 8/1999 | Nakajima et al. | |
| 5,953,597 A | 9/1999 | Kusumoto et al. | |
| 5,962,870 A | 10/1999 | Yamazaki et al. | |
| 5,970,368 A | 10/1999 | Sasaki et al. | |
| 5,981,399 A * | 11/1999 | Kawamura et al. | 438/715 |
| 6,002,523 A | 12/1999 | Tanaka | |
| 6,013,928 A | 1/2000 | Yamazaki et al. | |
| 6,054,739 A | 4/2000 | Yamazaki et al. | |
| 6,137,633 A | 10/2000 | Tanaka | |
| 6,159,777 A | 12/2000 | Takenouchi et al. | |
| 6,160,827 A | 12/2000 | Tanaka | |
| 6,204,099 B1 | 3/2001 | Kusumoto et al. | |
| 6,210,996 B1 | 4/2001 | Yamazaki et al. | |
| 6,242,289 B1 | 6/2001 | Nakajima et al. | |
| 6,242,292 B1 | 6/2001 | Yamazaki et al. | |
| 6,265,745 B1 | 7/2001 | Kusumoto et al. | |
| 6,274,885 B1 | 8/2001 | Yamazaki et al. | |
| 6,281,470 B1 * | 8/2001 | Adachi | 219/121.62 |
| 6,285,042 B1 | 9/2001 | Ohtani et al. | |
| 6,310,727 B1 | 10/2001 | Tanaka | |
| 6,313,434 B1 * | 11/2001 | Patterson et al. | 219/121.69 |
| 6,322,625 B2 * | 11/2001 | Im | 117/43 |
| 6,331,723 B1 | 12/2001 | Yamazaki et al. | |
| 6,358,784 B1 * | 3/2002 | Zhang et al. | 438/166 |
| 6,392,810 B1 | 5/2002 | Tanaka | |
| 6,426,245 B1 | 7/2002 | Kawasaki et al. | |
| 6,437,284 B1 * | 8/2002 | Okamoto et al. | 219/121.73 |
| 6,451,631 B1 * | 9/2002 | Grigoropoulos et al. | 438/149 |
| 6,455,359 B1 | 9/2002 | Yamazaki et al. | |
| 6,489,222 B2 | 12/2002 | Yoshimoto | |
| 6,512,634 B2 | 1/2003 | Tanaka | |
| 6,556,711 B2 | 4/2003 | Koga et al. | |
| 6,567,219 B1 * | 5/2003 | Tanaka | 359/624 |
| 6,599,788 B1 | 7/2003 | Kawasaki et al. | |
| 6,602,744 B1 | 8/2003 | Ino et al. | |
| 6,613,619 B2 | 9/2003 | Yamazaki et al. | |
| 6,660,609 B2 | 12/2003 | Tanaka et al. | |
| 6,675,057 B2 * | 1/2004 | Liu | 700/117 |
| 6,759,628 B1 | 7/2004 | Ino et al. | |
| 6,844,249 B2 | 1/2005 | Kawasaki et al. | |
| 6,847,006 B2 * | 1/2005 | Yamazaki et al. | 219/121.76 |
| 7,132,375 B2 | 11/2006 | Yamazaki | |
| 7,160,764 B2 | 1/2007 | Tanaka | |
| 7,217,605 B2 | 5/2007 | Kawasaki et al. | |
| 2001/0010702 A1 | 8/2001 | Tanaka | |
| 2001/0015441 A1 | 8/2001 | Kawasaki et al. | |
| 2001/0055830 A1 | 12/2001 | Yoshimoto | |
| 2002/0017685 A1 | 2/2002 | Kasahara et al. | |
| 2002/0024047 A1 | 2/2002 | Yamazaki et al. | |
| 2002/0094008 A1 | 7/2002 | Tanaka | |
| 2002/0094613 A1 | 7/2002 | Yamazaki et al. | |
| 2003/0024905 A1 | 2/2003 | Tanaka | |
| 2003/0086182 A1 | 5/2003 | Tanaka et al. | |
| 2003/0143337 A1 | 7/2003 | Tanaka | |
| 2003/0168437 A1 | 9/2003 | Tanaka | |
| 2007/0099401 A1 | 5/2007 | Tanaka | |
| 2007/0254392 A1 | 11/2007 | Tanaka | |

FOREIGN PATENT DOCUMENTS

| | | |
|---|---|---|
| JP | 62-165019 | 7/1987 |
| JP | 62-216320 | 9/1987 |
| JP | 02-181419 | 7/1990 |
| JP | 03-221336 | 9/1991 |
| JP | 05-104276 | 4/1993 |
| JP | 05-238548 | 9/1993 |
| JP | 06-079487 | 3/1994 |
| JP | 07-168040 | 7/1995 |
| JP | 09-102468 | 4/1997 |
| JP | 09-141479 | 6/1997 |
| JP | 09-321311 | 12/1997 |
| JP | 2000-019362 | 1/2000 |
| JP | 2000-269161 | 9/2000 |
| JP | 201-102323 | 4/2001 |
| JP | 2001-156014 | 6/2001 |
| JP | 2002-231655 | 8/2002 |
| KR | 1996-026980 | 7/1996 |

* cited by examiner

Y-AXIS DIRECTION

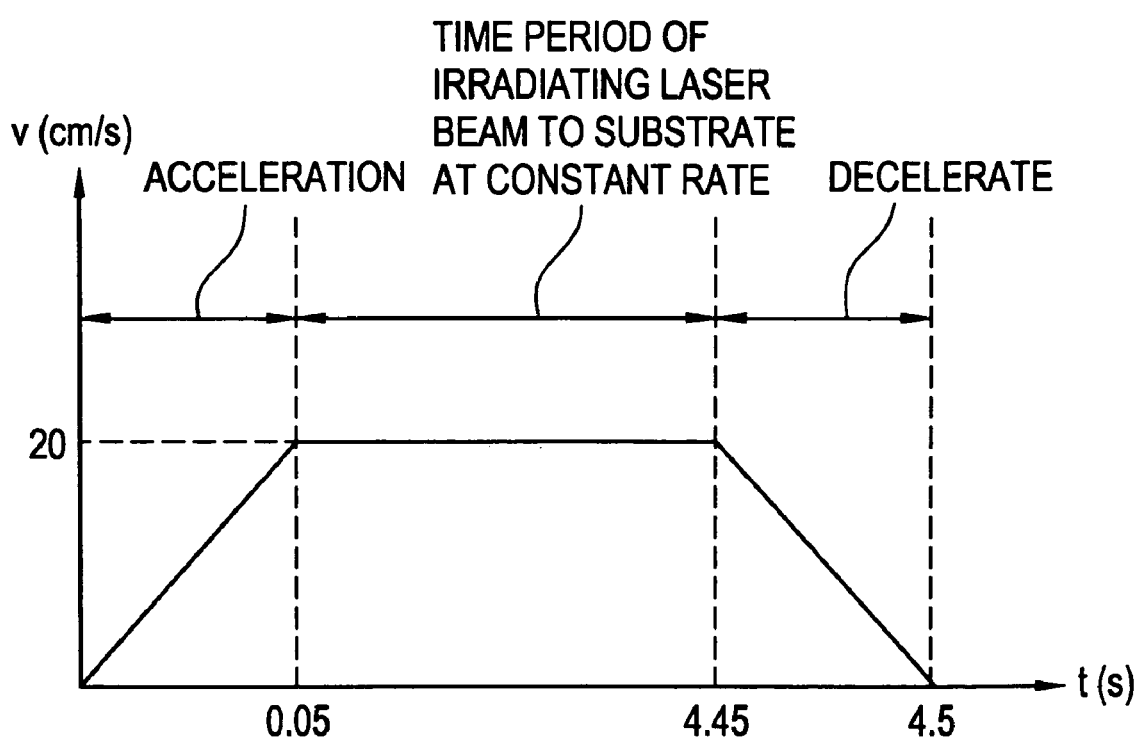

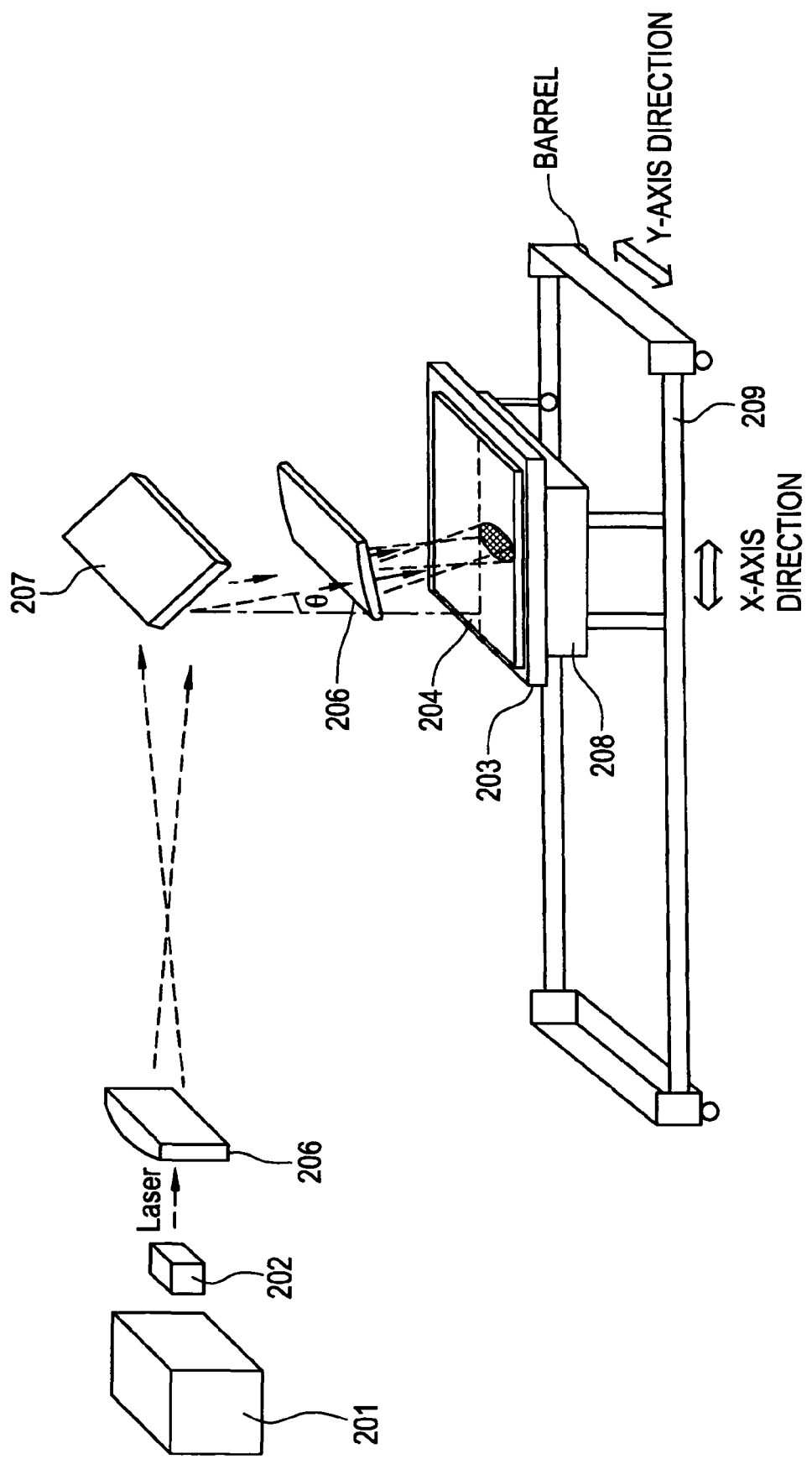

FLOWING DIRECTION
OF CARRIER
(CHANNEL DIRECTION)

FLOWING DIRECTION
OF CARRIER
(CHANNEL DIRECTION)

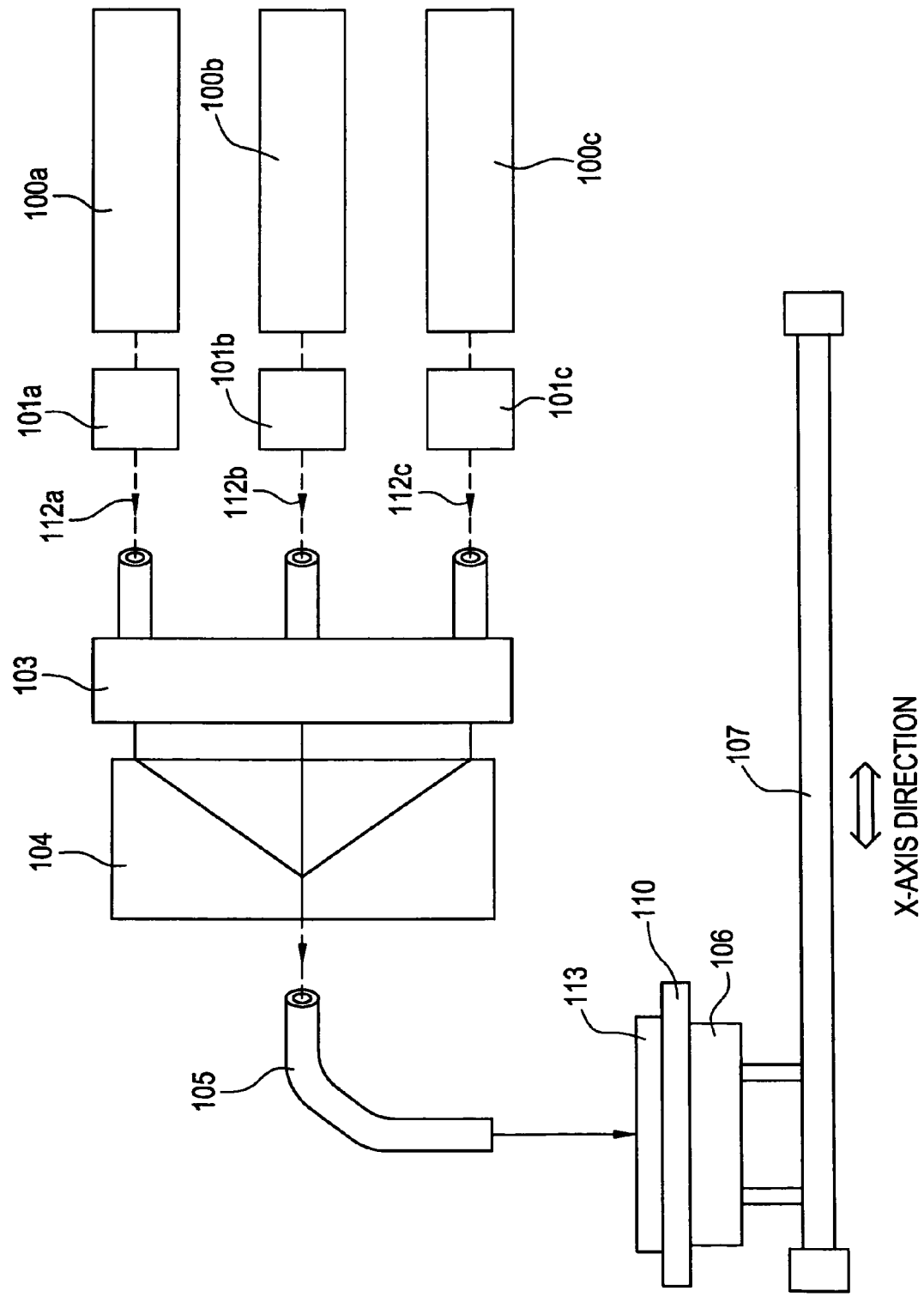

LASER ANNEALING APPARATUS AND SEMICONDUCTOR DEVICE MANUFACTURING METHOD

BACKGROUND OF THE INVENTION

1. Field of the Invention

The present invention relates to a laser annealer employing a laser beam. The present invention also relates to a semiconductor device manufacturing method for manufacturing a semiconductor device through steps including a step using a laser annealing method. The semiconductor device means herein one of a general device which can function by employing semiconductor characteristic and which involve an electro-optic device such as a liquid crystal display and a light emitting device, and an electronic device which has the electro-optic device incorporated therein as a component.

In recent years, study has been broadly made on the art to carry out laser anneal on a semiconductor film formed over an insulating substrate of glass or the like in order for crystallization or improving crystallinity. Such semiconductor films often use silicon. In the present description, the means for crystallizing a semiconductor film by using a laser beam and obtaining a crystalline semiconductor film is referred to as laser crystallization.

The glass substrate is cheap in price and excellent in workability as compared to the conventionally often used synthetic quartz glass substrate, having a merit to easily prepare a large-area substrate. This is the reason of the studies noted above. Meanwhile, the laser is used, by preference, in crystallization because the glass substrate is low in melting point. The laser can deliver high energy only to the semiconductor film without substantially increasing in substrate temperature. Furthermore, throughput is by far high as compared to the heating means using an electric furnace.

Crystalline semiconductor films are formed from many crystal grains, and therefore they are also referred to as polycrystalline semiconductor films. Because the crystalline semiconductor film formed through laser anneal has high mobility, thin film transistors (TFTs) can be formed using the crystalline semiconductor film. They are broadly utilized, e.g. in a monolithic liquid-crystal electrooptical device having pixel-driving and drive-circuit TFTs formed on one glass substrate.

Meanwhile, there is preferential use of a method for laser anneal that the high-output pulse laser light, of an excimer laser or the like, is formed through an optical system into a square spot in several-centimeter square or a linear form having a length of 10 centimeters or longer on an irradiation plane in order to scan the laser light (or moving a laser-light irradiation position relatively to the irradiated plane), because of high producibility and industrial superiority. By the way, to form the laser light to linear shape means that the laser light is formed to linear shape at the irradiated plane. It means that the cross-sectional shape of laser light forms linear shape. Further, the "linear shape" referred herein is not strictly means for "line" but means for the rectangular which aspect is large or oval shape. For example, the aspect ratio is 10 or more. (Preferably 100-10000).

Particularly, the use of a linear beam can realize laser irradiation over the entire irradiation surface by scanning only in the direction perpendicular to a lengthwise direction of the linear beam, differently from the case using the laser light in a spot form requiring scanning, providing high production efficiency. The scanning in a direction perpendicular to the lengthwise direction is carried out because the direction of scanning is the highest in efficiency. Due to the high production efficiency, the use of a linear beam formed of pulse-oscillated excimer laser light through a proper optical system in the current laser anneal process is in the mainstream of the technology to manufacture liquid crystal display devices using TFTs.

2. Related Art

To form an excimer laser beam, KrF (wavelength: 248 nm) or XeCl (wavelength: 308 nm) is used as excitation gas. However, such gases as Kr (krypton) and Xe (xenon) are quite expensive. Due to this, if Kr or Xe is employed and gas exchange is conducted more frequently, manufacturing cost is disadvantageously pushed up.

In addition, attachments such as a laser tube for laser oscillation and a gas purifier for removing unnecessary compounds generated during oscillation are required to be replaced once in two or three years. Most of these attachments are expensive, which again disadvantageously pushes up manufacturing cost.

As described above, a laser irradiation device employing an excimer laser beam exhibits high performance. However, the laser irradiation device of this type takes much labor for maintenance and the running cost (which means herein cost entailed by the operation of the device) thereof is disadvantageously high if used as a mass-production laser irradiation device.

Therefore, to realize a laser lower in running cost than the excimer laser and a laser annealing method employing the laser, there is proposed a method of using a solid-state laser (which outputs a laser beam with a crystal rod set as a resonant cavity).

Using a YAG laser which is one of the typical solid-state lasers, a laser beam is irradiated to a semiconductor film. According to the YAG laser, a laser beam (wavelength: 532 nm) which is modulated to a second harmonic by a nonlinear optical element is processed into a linear beam, which has a linear shape on an irradiation surface, by an optical system. The semiconductor film is an amorphous silicon film which has a thickness of 55 nm and which is formed on a substrate ("1737 substrate" manufactured by Corning Inc.) by a plasma CVD method. However, on a crystalline silicon film obtained by executing steps including a step using a laser annealing method to the amorphous silicon film, a concentric pattern is formed. This pattern indicates that the material property of the crystalline silicon film in the plane is not uniform. Due to this, if a TFT is manufactured using a crystalline semiconductor on which a concentric pattern is formed, the pattern adversely influences the electrical characteristic of the TFT. Here, a pattern of concentric circles is described as concentric pattern.

Further, as the screen of the electro-optic device is made large in size, the area of mother glass increases. Following this, demand for irradiating a laser beam to a semiconductor layer provided on the mother glass serving as a substrate at high rate rises for the laser annealing method.

In addition, demand for compensating for the poor power of a laser beam which is employed to temporarily melt a semiconductor layer in the crystallization of the semiconductor layer rises for the laser annealing method.

SUMMARY OF THE INVENTION

It is, therefore, an object of the present invention to provide a laser annealing method for a laser irradiation device which requires low running cost, capable of preventing the generation of a concentric pattern or decreasing the formation thereof and to provide a semiconductor device manufacturing method including a step using the laser annealing method.

A cause for generating the concentric pattern will be considered. A laser beam irradiated to an amorphous silicon film is a linear beam which has a linear shape on an irradiation surface. Due to this, even if some pattern is formed on a crystalline silicon film which is obtained after the irradiation of the laser beam, the pattern should be parallel or vertical to the linear beam as long as a semiconductor film, a substrate and a substrate stage are completely flat. However, an observed pattern is a concentric pattern. From this, it is considered that the generation of the concentric pattern is not derived from the linear beam. Namely, it can be estimated that the thickness of the semiconductor film, the laser beam absorption coefficient of the semiconductor film, the substrate or the substrate stage, or a combination thereof causes the generation of the concentric pattern.

The laser beam absorption coefficient of the semiconductor film among the causes for generating the concentric pattern will be considered. The reflectance and transmittance of the amorphous silicon film (thickness: 55 nm) relative to wavelength are obtained and the results are shown in FIGS. 10A and 10B, respectively. It is noted that the amorphous silicon film is formed on the 1737 substrate by the plasma CVD method. FIGS. 10A and 10B show that the reflectance and transmittance of the amorphous silicon film for the second harmonic (wavelength: 532 nm) of the YAG laser are 26% and 38%, respectively. It is considered that reflected light from the surface of the amorphous silicon film interferes with the laser beam transmitted by the amorphous silicon film on a certain surface. It can be estimated that this causes the concentric pattern.

To prevent or decrease the generation of the concentric pattern, therefore, it is considered that it is necessary to prevent such interference. To prevent the interference, a plurality of laser beams are condensed, the condensed laser beams are irradiated to the semiconductor film on the surface of the substrate and the semiconductor film is thereby crystallized.

Accordingly, a laser annealer according to the present invention is a laser annealer comprising: a laser light source outputting a laser beam; and a moving mechanism for moving a substrate irradiated with the laser beam aslant, and characterized in that the moving mechanism has a function of reciprocating by a distance equal to or larger than a length of one edge of the substrate, and of moving in a direction perpendicular to the reciprocating direction by a distance equal to or smaller than a length of the laser beam in a Y axis direction in a region in which the laser beam is irradiated to the substrate. As a result, by employing the laser annealer according to the present invention, it is possible to prevent or decrease the generation of a concentric pattern, which has been disadvantageously generated by the irradiation of a laser beam and to improve the reliability of a resultant semiconductor device. It is also possible to uniformly irradiate a laser beam to even a semiconductor film on a large-sized substrate.

Further, a laser annealer according to the present invention is a laser annealer comprising: a laser light source outputting a laser beam; a nonlinear optical element modulating the laser beam; a waveguide condensing the modulated laser beam: and a moving mechanism for moving a substrate irradiated with the condensed laser beam aslant, and characterized in that the moving mechanism has a function of reciprocating by a distance equal to or larger than a length of one edge of the substrate, and of moving in a direction perpendicular to the reciprocating direction by a distance equal to or smaller than a length of the laser beam in a Y axis direction in a region in which the laser beam is irradiated to the substrate. As a result, by employing the laser annealer according to the present invention, it is possible to prevent or decrease the generation of a concentric pattern, which has been disadvantageously generated by the irradiation of a laser beam and to improve the reliability of a resultant semiconductor device. It is also possible to uniformly irradiate a laser beam to even a semiconductor film on a large-sized substrate.

A semiconductor device manufacturing method according to the present invention is a semiconductor device manufacturing method comprising the steps of: forming a semiconductor film on a substrate; and irradiating a plurality of laser beams to the semiconductor film, and characterized in that a step of irradiating the laser beams aslant to the semiconductor film while moving the substrate at a constant rate, and a step of moving the substrate in a direction perpendicular to the moving direction by a distance equal to or smaller than a width of the laser beams are continuously repeated. As a result, by employing the laser annealer according to the present invention, it is possible to prevent or decrease the generation of a concentric pattern, which has been disadvantageously generated by the irradiation of a laser beam and to improve the reliability of a resultant semiconductor device. It is also possible to uniformly irradiate a laser beam to even a semiconductor film on a large-sized substrate.

A semiconductor device manufacturing method according to the present invention is a semiconductor device manufacturing method comprising the steps of: forming a semiconductor film on a substrate; and irradiating a plurality of laser beams to the semiconductor film, and characterized in that a step of modulating the plurality of laser beams by a plurality of nonlinear optical elements, respectively, a step of causing the modulated laser beams to pass through a waveguide and thereby condensing the modulated laser beams, and a step of irradiating the condensed laser beams aslant to the semiconductor film while moving the substrate at a constant rate, and moving the substrate in a direction perpendicular to the moving direction by a distance equal to or smaller than the laser beam, are continuously repeated. As a result, by employing the laser annealer according to the present invention, it is possible to prevent or decrease the generation of a concentric pattern, which has been disadvantageously generated by the irradiation of a laser beam and to improve the reliability of a resultant semiconductor device. It is also possible to uniformly irradiate a laser beam to even a semiconductor film on a large-sized substrate.

Further, a semiconductor device manufacturing method according to the present invention is a semiconductor device manufacturing method characterized in that the constant rate falls within a range of 20 to 200 cm/s. As a result, it is possible to irradiate a laser beam to a semiconductor layer provided on a large-sized substrate at high rate.

In addition, the laser beams employed in the present invention may be processed into elliptic shape by an optical system.

Furthermore, a semiconductor device manufacturing method according to the present invention is a semiconductor device manufacturing method characterized in that the laser beam is incident on the semiconductor film at an aslant angle of 5 to 10° with respect to a normal line direction of a front surface of the substrate or a normal line direction of a rear surface of the substrate. This method has been contrived from the fact that if a step using a laser annealing method is executed while inclining the substrate, no concentric pattern appears, and characterized by irradiating a laser beam to the substrate with an angle with respect to the substrate. By applying the present invention, it is possible to remove or decrease the irregularity of the material property of a crystalline semiconductor film caused by the interference of the laser beam. If a TFT is manufactured using such a crystalline semiconductor film, the electrical characteristic of the TFT is improved.

Moreover, semiconductor device manufacturing method according to the present invention is a semiconductor device manufacturing method characterized in that crystallization of the semiconductor substrate is progressed in a direction parallel to the substrate and closer to an end face of the substrate. By employing the semiconductor device manufacturing method according to the present invention, it is possible to manufacture a semiconductor device in which the surface of a semiconductor layer is flat and which has high electrical mobility.

Additionally, the laser beam may be irradiated to the semiconductor film from a rear surface side of the substrate (an opposite side of the surface where semiconductor film is formed).

As for the laser beam, an ordinary known laser such as a YAG laser (which normally indicates an Nd: YAG laser), an Nd: YLF laser, an Nd: YVO$_4$ laser, an Nd: YAlO$_3$ laser, a ruby laser, a Ti: sapphire laser or a glass laser can be employed. The YAG laser which is excellent in coherency and pulse energy is particularly preferable.

If the YAG laser is employed, for example, it is preferable to use a second harmonic (wavelength: 532 nm). This is because the wavelength of the fundamental harmonic of the YAG laser (first harmonic) is as long as 1064 nm. The first harmonic can be modulated to the second, third or fourth harmonic by a wavelength modulator which includes a non-linear element. The respective harmonics can be formed according to a well-known technique. In this specification, it is assumed that "a laser beam from a solid-state laser" includes not only the first harmonic but also harmonics the wavelength of which is modulated halfway.

It is also possible to employ a Q switch method (Q modulation switch method) which is well utilized for the YAG laser. This method is to suddenly increase the Q factor of a laser resonator from a state of a sufficiently low Q factor to thereby output a quite steep pulse laser beam with quite high energy level.

The solid-state laser employed in the present invention can basically output a laser beam if a resonant mirror or a light source for exciting solid-state crystal is provided. Due to this, compared with the excimer laser, it does not take much labor for maintenance. That is, since the solid-state laser is far lower in running cost than the excimer laser, it is possible to greatly reduce semiconductor device manufacturing cost. In addition, if the frequency of the maintenance decreases, the operativity of a mass-production line improves and the overall throughput of the manufacturing process improves, which also greatly contributes to the reduction of the semiconductor device manufacturing cost. Besides, the area occupied by the solid-state laser is smaller than that of the excimer laser, it is advantageously effective for the design of a manufacturing line.

If the power of the laser beam is not lower than 10 W, uniform laser annealing can be performed even with a single laser beam. The laser beam having a power of not lower than 10 W suffices to melt the semiconductor layer in the crystallization of the semiconductor layer.

BRIEF DESCRIPTION OF THE DRAWINGS

FIG. 5 is a graph showing the relationship between processing target substrate moving time and rate;

FIG. 6 is a view which shows an example of a laser annealer according to the present invention;

FIG. 12 is a view which shows an example of a laser annealer; and

EMBODIMENT MODE

Figure 1:
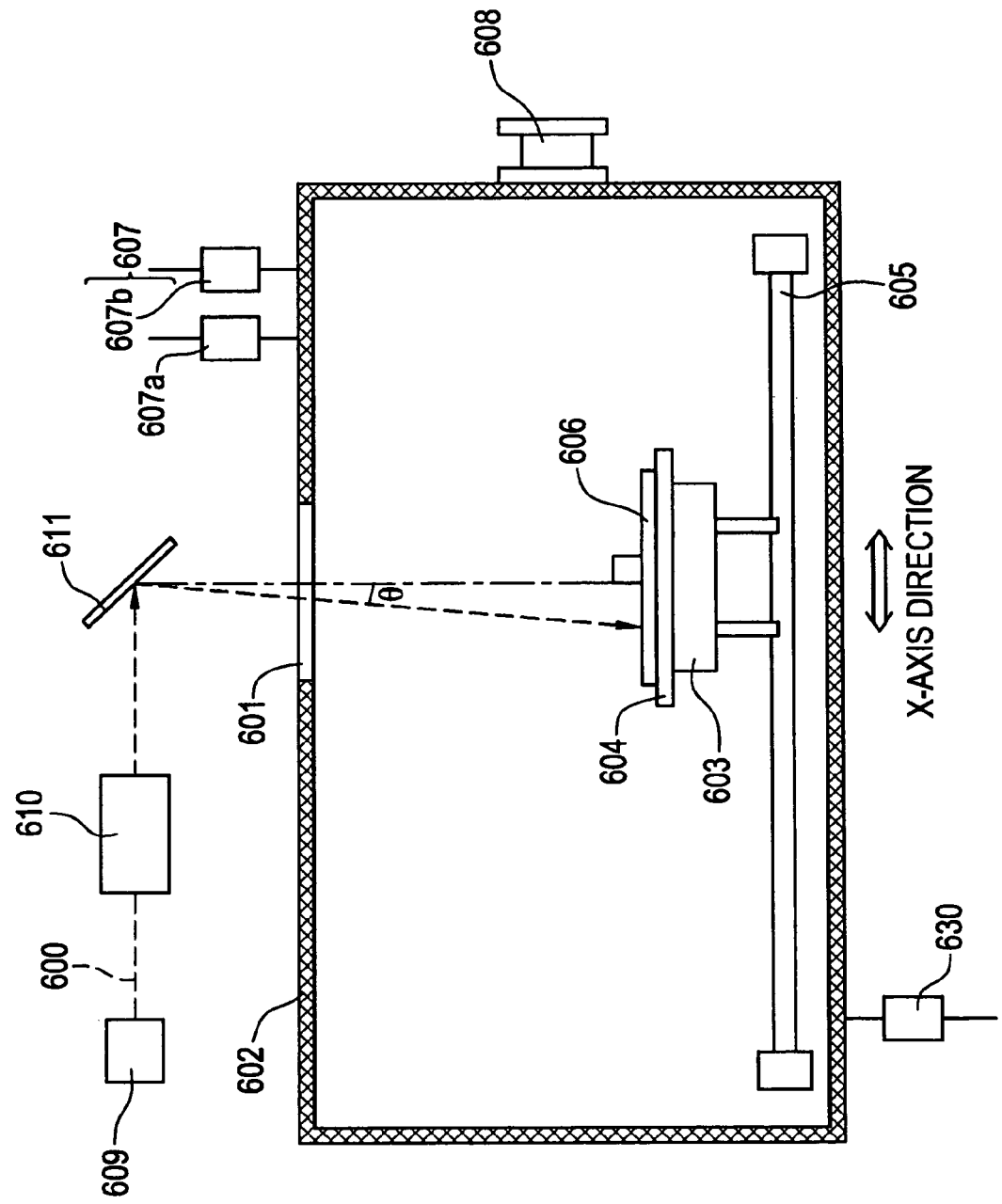
FIG. 1 is a view which shows an example of laser beam irradiation.

A laser beam irradiation method in one embodiment of the present invention will first be described with reference to FIG. 1.

Through a crystallization step by irradiating a laser beam to an amorphous silicon layer, a crystalline silicon layer is formed. This crystallization is conducted in a laser annealing chamber 602 in which a transparent window 601 is provided.

First, a light transmitting substrate made of barium borosilicate glass or aluminum borosilicate glass as represented by #7059 glass or #1737 glass manufactured by Corning Inc. is employed as a substrate. Alternatively, a quartz substrate or a silicon substrate may be employed as the substrate. In this embodiment, a glass substrate of a size of 680 mm×880 mm and a thickness of 1.1 mm is employed. In this specification, a substrate on which a foundation film and a semiconductor film are formed in this order is referred to as "processing target substrate".

Inside of the laser annealing chamber 602, a stand 603, a stage 604 provided on the stand 603, and a moving mechanism 605 for moving the stand 603 are disposed. Outside of the laser annealing chamber 602, an evacuation pump 630, a gas supply tube 607 and a gate valve 608 are disposed.

The stand 603 is provided so that the base 603 is moved in directions at right angle (X axis direction and Y axis direction) to the normal line direction of a processing target substrate 606 by the moving mechanism 605 for moving the stand 603 to thereby irradiate a laser beam to the upper surface of the processing target substrate 606. A laser beam irradiation direction is aslant with respect to the normal line direction of the processing target substrate 606 by 5 to 10°.

Figure 2:
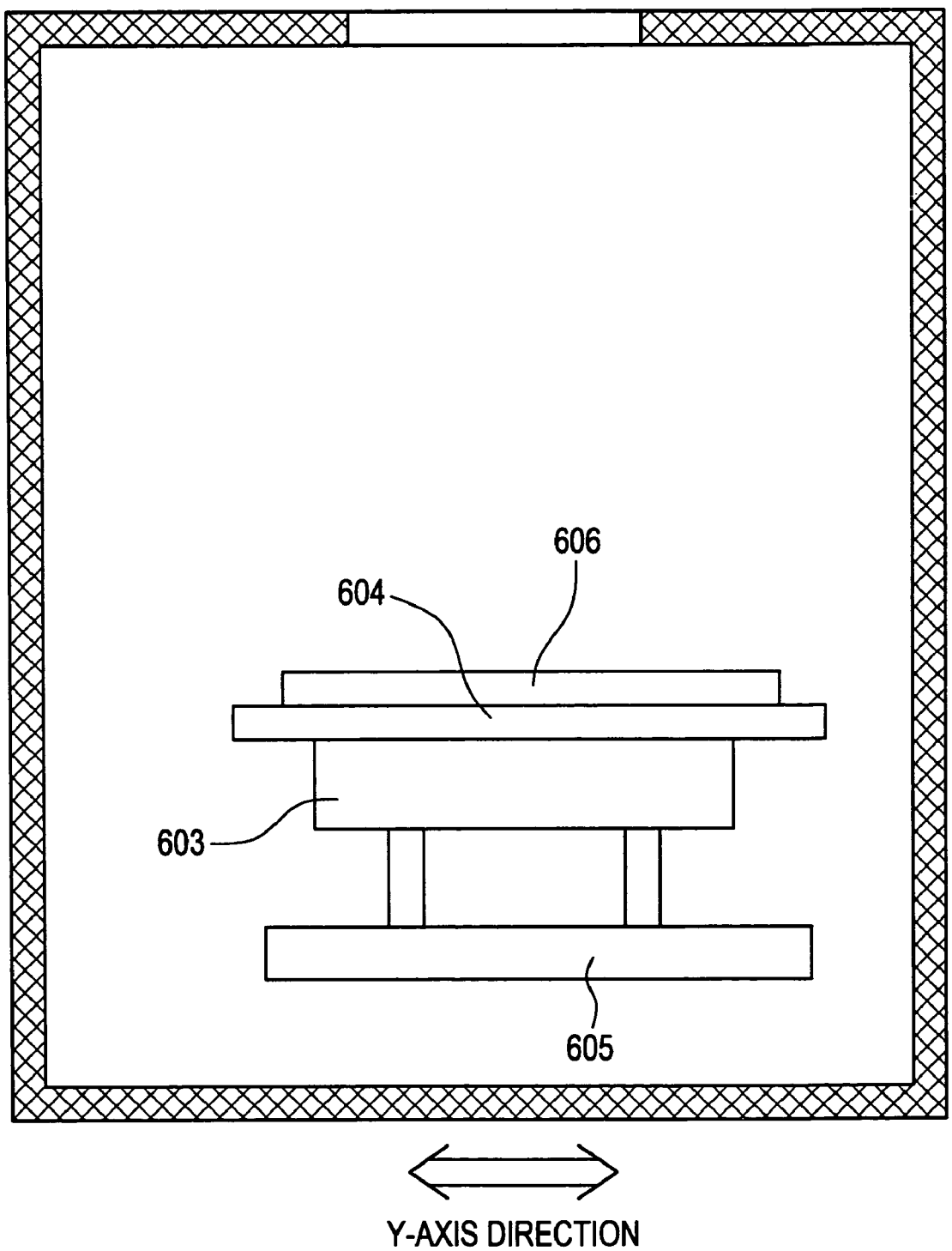
FIG. 2 is a view which shows an example of a laser annealer.
Figure 3:
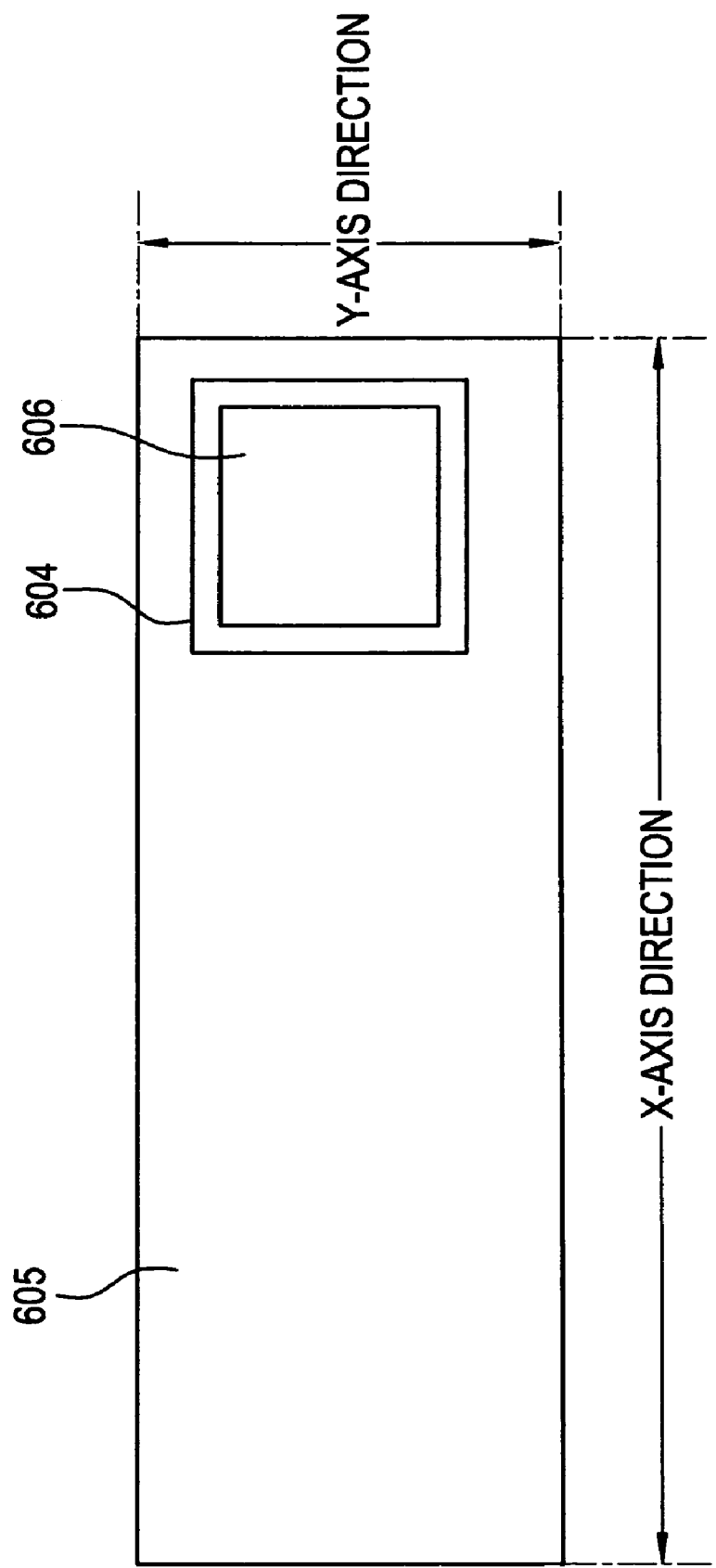
FIG. 3 is a view which shows the example of the laser annealer.

In this specification, a semiconductor manufacturing device which includes the stage 604 and the moving mechanism 605 is referred to as a laser annealer. The base 603 may be provided between the stage 604 and the moving mechanism 605. The laser annealer may include a laser oscillator 609, an optical system 610 and a mirror 611 in addition to the above-stated constituent elements. An amorphous silicon layer is crystallized by a combination of the laser annealing chamber 602 in which the laser annealer and the transparent window 601 are disposed, the evacuation pump 630, the gas supply tube 607 and the gate valve 608. FIG. 2 shows the laser annealer of FIG. 1 from the Y axis direction. FIG. 3 shows the laser annealer viewed from a mirror side (upward of the processing target substrate 606). The moving mechanism 605 can move by a distance equal to or larger than the length of one edge of the processing target substrate 606 in the X axis direction and can move by a distance equal to or smaller than the width of a laser beam in the Y axis direction perpendicular to the X direction. It is to be noted that the width of the laser beam is a width of the laser beam in a direction perpendicular to a moving direction by the moving mechanism.

As shown in FIG. 1, a laser beam 600 is emitted from the laser oscillator 609, processed to have an elliptic cross section by the optical system 610, reflected by the mirror 611, caused to pass through the transparent window 601 and irradiated to the processing target substrate 606. The irradiation light beam may be a rectangular light beam.

Figure 4:
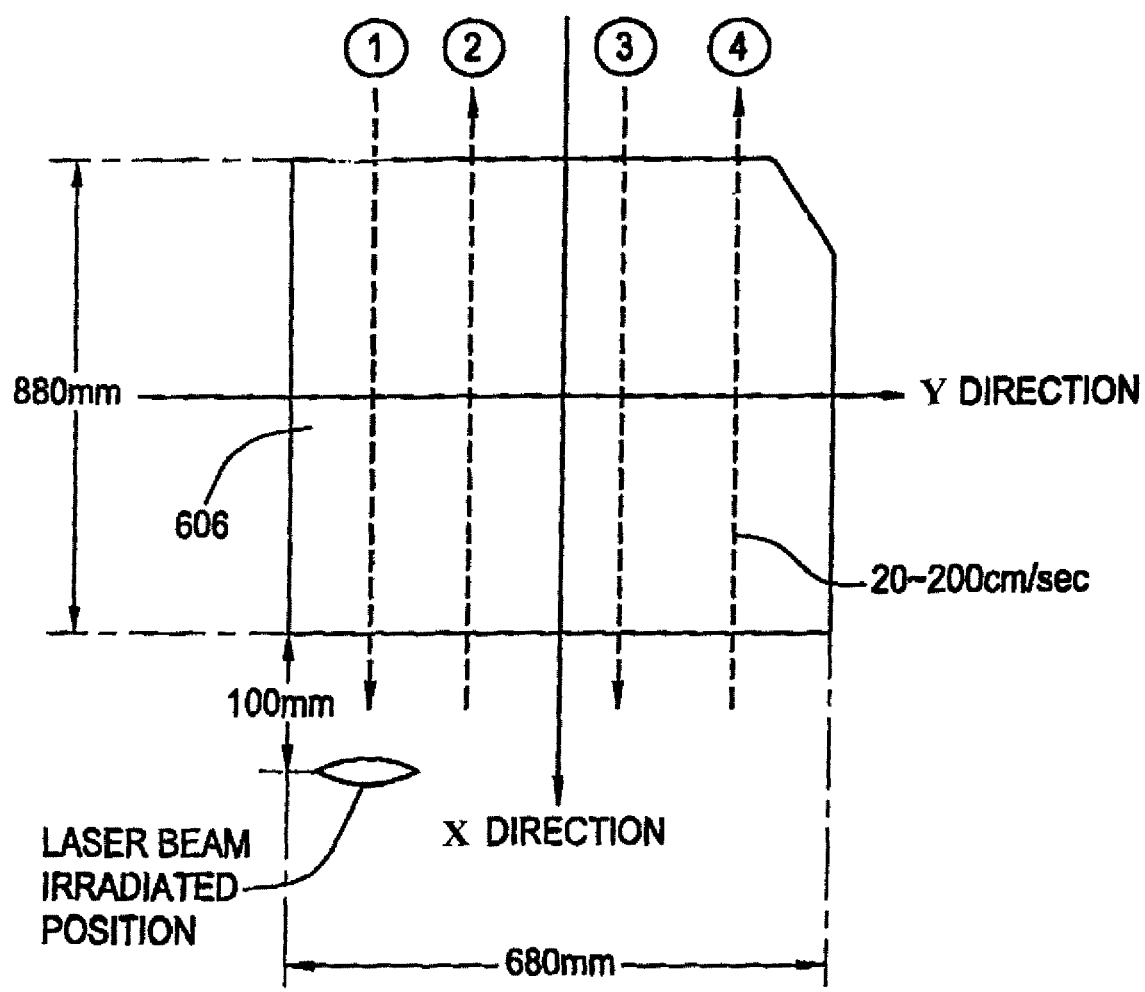
FIG. 4 is an explanatory view for the X and Y directions of a processing target substrate.

FIG. 4 is a view which shows the processing target substrate 606 from the normal line direction. The processing target substrate 606 is provided so that the end portion of the processing target substrate 606 is located at a position away from a laser beam irradiated position by 100 mm. Next, the moving mechanism 605 is moved while being accelerated so as to move the processing target substrate 606 in a direction of an arrow ①. After 0.05 seconds, the laser beam 600 is irradiated to the processing target substrate 606 at a constant rate (20 cm/s in this embodiment). If the laser beam irradiated position is outside of the processing target substrate 606, the moving rate is decelerated (FIG. 5). Next, the same step as that in the arrow ① direction is executed in a direction of an arrow ② which is opposite to the arrow ① direction, to thereby crystallize the substrate. To execute a step in a direction of an arrow ③ and that in a direction of an arrow ④, the step in the arrow ① direction and that in the arrow ② direction may be repeated, respectively. If necessary, these steps may be repeatedly executed to irradiate the entire surface of the processing target substrate 606 with the laser beam. The semiconductor film in the processing target substrate 606 is crystallized in a direction which is parallel to the processing target substrate 606 and which is closer to the end face of the processing target substrate 606.

The rate of moving the processing target substrate 606 may be set at a constant rate which falls within a range of 20 to 200 cm/s.

In the crystallization, the processing target substrate 606 may be disposed on the stage 604 to keep the temperature of the processing target substrate 606 to be a predetermined temperature by a heater provided in the stand 603. If the amorphous silicon layer is crystallized at a temperature of 450° C., the grain diameter of crystals increases.

As the laser oscillator 609, a laser oscillator which oscillates a CW laser beam as the laser beam 600 is employed.

The atmosphere of the laser annealing chamber 602 may be controlled by the evacuation pump 630 which is provided as a pressure reduction and evacuation means. A gas supply tube 607a which is connected to a hydrogen gas cylinder through a valve and a gas supply tube 607b which is connected to a nitrogen or the other gas cylinder through a valve are provided as the gas supply tube 607 which serves as a gas supply means. In this embodiment, the laser beam is irradiated at ordinary temperature at ordinary pressure.

In this embodiment, the laser beam is irradiated to the semiconductor film on the surface of the substrate while moving the substrate at a constant rate between 20 and 200 cm/s. Due to this, a uniform laser beam can be irradiated to even the semiconductor film on a large-sized substrate.

In this embodiment, power is set at 10 W. However, if the power is set at not lower than 10 W, uniform laser annealing can be performed even with a single laser beam. The laser beam having a power of not lower than 10 W suffices to melt the semiconductor layer in the crystallization of the semiconductor layer.

In this embodiment, a laser beam is emitted from one laser oscillator. Alternatively, a plurality of laser beams may be condensed using a plurality of laser oscillators so as to increase beam intensity. By thus condensing the laser beams, it is possible to decrease the generation of the concentric pattern and to thereby improve the reliability of a resultant semiconductor device. If necessary, a plurality of optical systems, a plurality of mirrors, a fiber and the like may be employed.

According to the present invention, the laser beam is processed to have an elliptic cross section in the step using the laser annealing method to thereby improve throughput. Besides, by using a solid-state laser easy to maintain, higher throughput than that by laser annealing employing a conventional excimer laser can be attained. Consequently, it is possible to decrease the manufacturing cost of a TFT and the semiconductor device such as a display formed out of the TFT.

Moreover, by irradiating the laser beam aslant to the semiconductor film, it is possible to remove or decrease the concentric pattern generated on the semiconductor film and to thereby make the material property of the semiconductor film after the step using the laser annealing method uniform. If a semiconductor device is manufactured using such a semiconductor film, it is possible to greatly improve the performance of the semiconductor device.

DESCRIPTION OF THE EMBODIMENTS OF THE INVENTION

Embodiment 1

An optical system will be described below with reference to FIG. 6 in this embodiment.

As a laser oscillator 201, it is desirable to use a high-power laser. (a YAG laser, a YVO$_4$ laser or the like). Of course, a gas laser, a glass laser or the like may also be used as long as it has high power. The laser light generated from the laser oscillator 201 is formed into a linear beam whose irradiation plane has a linear shape, by using the optical system. The optical system uses, for example, a long focal length cylindrical lens 205 for enlarging a laser beam into a long beam and a cylindrical lens 206 for converging a laser beam into a thin beam. By using such long focal length cylindrical lenses, it is possible to obtain a laser beam which is reduced in aberration and is uniform in energy distribution at or near the irradiation plane. In addition, the long focal length cylindrical lenses are effective in restraining a remarkable difference from occurring between the beam width of a beam incident on the semiconductor film and the beam width of a beam reflected from the back surface of the substrate. Experiments of the present inventor showed that when a cylindrical lens having a focal length of 500 mm or more was used, the influence of aberration was able to be drastically reduced.

A reflecting mirror 207 is provided in front of the cylindrical lens 206 so that the traveling direction of the laser beam can be changed. The angle at which the laser beam is made incident on the irradiation plane can be adjusted to the desired angle θ by the reflecting mirror 207. If the angle of the cylindrical lens 206 is changed according to the angle of the reflecting mirror 207, a laser beam having far higher symmetry can be formed on the irradiation plane.

In addition, when linear beams are to be irradiated onto a semiconductor film, the irradiation is carried out with a scanning overlapping ration of 0 to 80% of the laser beam (laser beam in the Y-axis direction in the present Embodiment) during the scanning. It is to be noted that in case of a pulsed laser, the irradiation can be carried out with an overlapping ratio of 50 to 98% between the successively irradiated laser beams, and alternatively with no overlapping. Since optimum conditions differ according to the states of semiconductor films or the delay periods of laser beams, it is preferable that an operator appropriately determine the optimum conditions.

In Embodiment 1, a pulsed laser (Output 20 W, frequency 30 Hz, YAG) was used as the laser oscillator 201. The pulsed laser beam was modulated to a second harmonic by a nonlinear optical element 202 and was then formed into a linear beam of width 130 mm and length 0.4 mm by using the optical system, and the linear beam was irradiated onto the semiconductor film. At this time, the linear beam was irradiated with an angular deviation of 5 to 10 degrees from the direction perpendicular to the substrate 204.

Stand 208 is provided under a stage 203, and moving mechanism 209 is provided under the stand 208. A substrate 204 can be moved in the X axis direction and Y axis direction by moving mechanism 209. A ball, a barrel, a motor and the like may be provided below the moving mechanism 209.

The semiconductor film in the processing target substrate 204 is crystallized in a direction which is parallel to the processing target substrate 204 and witch is closer to the end face of the processing target substrate 606.

Moreover, by irradiating the laser beam aslant to the semiconductor film of the processing target substrate 204, it is possible to remove or decrease the concentric pattern generated on the semiconductor film and to thereby make the material property of the semiconductor film after the step using the laser annealing method uniform. If a semiconductor device is manufactured using such a semiconductor film, it is possible to greatly improve the performance of the semiconductor device.

Embodiment 2

This embodiment describes the method of crystalline for the laser anneal device.

Figure 7A:
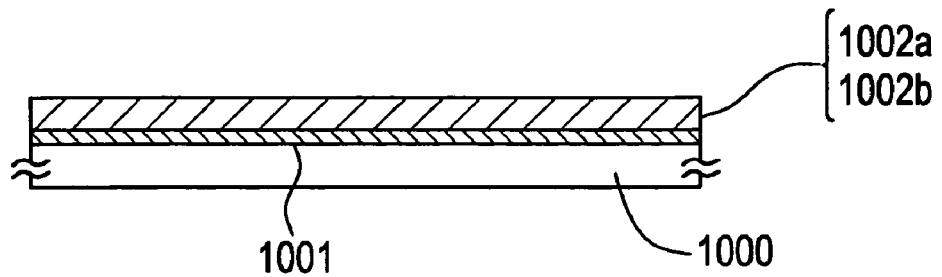
FIGS. 7A to 7D show semiconductor device manufacturing steps.
Figure 7B:
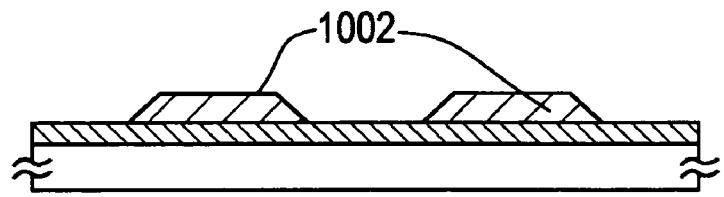

First, a glass substrate (Corning 1737 with a glass distortion temperature of 667° C.) was prepared as a substrate 1000. Then, a protective film 1001 is formed on the substrate 1000, and a tantalum nitride film 1002a (50 nm thick) and tantalum film 1002a (250 nm thick) were formed successively in the form of a multilayer configuration on the protective film 1000 by sputtering. (FIG. 7A) Then, the gate electrode 1002 having a multi layer configuration formed by photolisography, which is conventional patterning method.

Figure 7C:
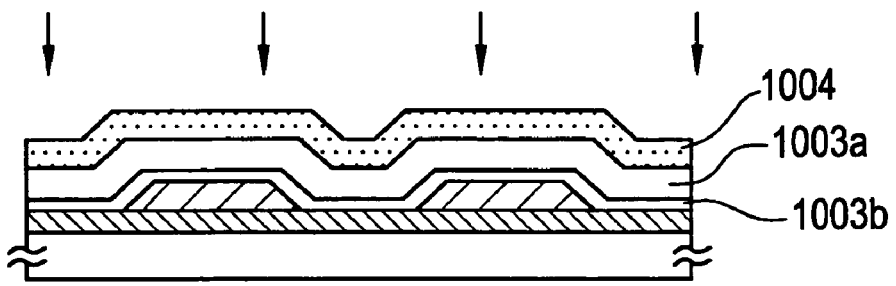

Subsequently, the gate insulating film and the amorphous semiconductor film 1004 were formed successively in the form of a multilayer configuration without being exposed to the atmosphere (FIG. 7C). In this embodiment, in order to prevent impurities from diffusing from the gate wiring to the semiconductor film and the gate insulating film during fabrication, the silicon nitride film 1003a (50 nm in thickness) and the silicon oxide film 1003b (125 nm in thickness) were formed in the form of a multilayer configuration by means of the plasma CVD method to allow the layer to serve as a gate insulating film of a multilayer configuration. In this embodiment, a two layer insulating film is employed as the gate insulating film, however, the gate insulating film may be of a single layer or of a multilayer configuration with three layers or more. In addition, in this embodiment, an amorphous silicon film 1004 54 nm in thickness was formed on the gate insulating film as the amorphous semiconductor film 104 by means of the plasma CVD method. Furthermore, the formation in the form of a multilayer configuration was carried out successively without exposure to the atmosphere so that each interface of the layers does not have contaminants adhered thereto from the atmosphere.

Thereafter, heating treatment was carried out (at a temperature of 500° C. for one hour) in order to reduce the concentration of hydrogen, which prevents the crystallization of the semiconductor film, in the amorphous silicon film.

Figure 7D:
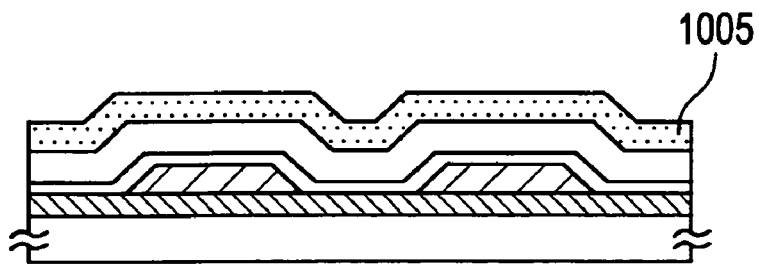

After the state shown in FIG. 7C has been obtained, the amorphous semiconductor film 1004 was irradiated with infrared light or ultraviolet light (laser annealing) to be crystallized (laser crystallization) in order to form the crystalline semiconductor film 1005 (semiconductor film including crystals) (FIG. 7D). The amorphous semiconductor film 1004 is crystallized in a direction which is parallel to the substrate 1000 and which is closer to the end face of the substrate 1000.

In the case of using ultraviolet light as the crystallization technique, laser light of intensified light emitted from an ultraviolet light lamp can be used, while in the case of using infrared light, infrared laser light or an intensified light emitted from an infrared light lamp can be used. In this Embodiment, the $YVO_4$ CW laser beam is shaped oval and irradiated on the semiconductor film at an aslant angle of 5 to 10° with a scanning overlapping ratio of 0 to 80% of the laser beam (laser beam in the Y-axis direction in the present embodiment) during the scanning.

Furthermore, one can determine the conditions for laser crystallization (such as the wavelength of the laser light, the intensity of irradiation, the frequency of repetition, and the time of irradiation) as appropriate in consideration of the thickness of the amorphous semiconductor film 1004, the temperature of the substrate and so forth.

Furthermore, some conditions for laser crystallization may cause the semiconductor film to crystallize after passing through a melting state, or the semiconductor film to crystallize in a solid phase without being melted or in an intermittent state between the solid phase and liquid phase. This process allows the amorphous semiconductor film 1004 to crystallize and change into the crystalline semiconductor film 1005. In this embodiment, the crystalline semiconductor film is a polycrystalline silicon film (poly-silicon film).

Embodiment 3

Figure 8:
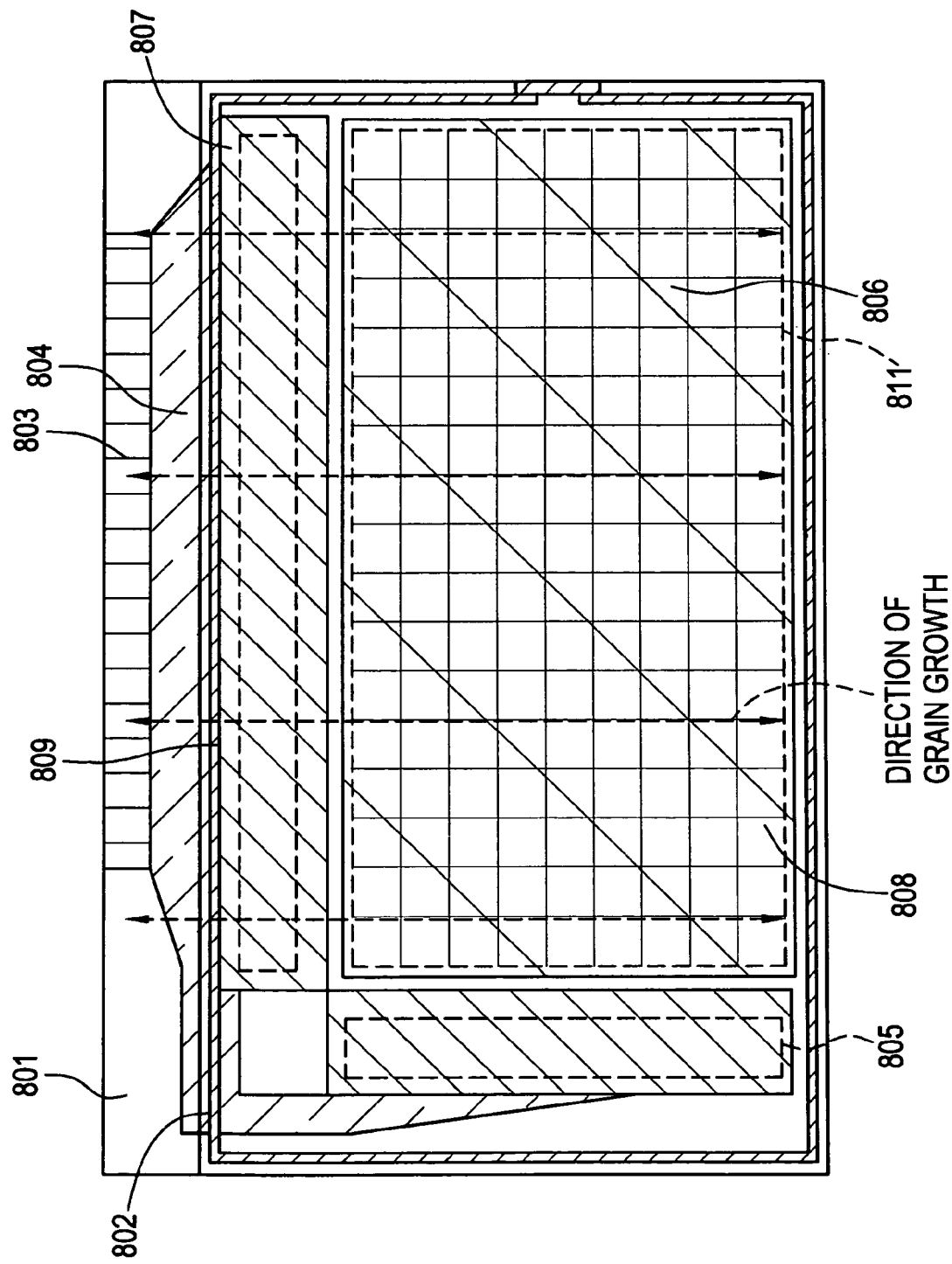
FIG. 8 is a view which shows a semiconductor device according to the present invention.

The structure of the active matrix liquid crystal display device obtained by using Embodiment 1 and 2 will be described with reference to the top view of FIG. 8 to 9.

In the top view of active matrix display device shown in FIG. 8A, the pixel portion 811, the driver circuit (general name of gate driving circuit 805 and source driving circuit 807), an external input terminal 803 to which an FPC (Flexible Printed Circuit) is bonded, a wiring 804 for connecting the external input terminal 803 with input sections of the respective circuits, and the like are formed on an active matrix substrate 801. The active matrix substrate 801 and an opposing substrate 802, on which a color filter and the like are formed, are bonded with each other, sandwiching an end-sealing material 809 therebetween.

A gate driving circuit has the function to input the signal to selected gate wiring 806. The gate wiring 806 is the wiring that connects to gate electrode electrically. And the selected gate wirings are selected one by one. Of course, an insulating film is provided on the gate wiring. On the other way, a source driving circuit has the function to receive the image data signal and apply the signal to the pixel electrode, which connected to the selected gate wiring. The source driving circuit 807 moves with matching the timing of gate driving circuit 805. Then, an image of active matrix type display device can be obtained by selecting the switching element (not shown) of each gate wiring and by applying the desired voltage through source wiring 808.

A color filter formed on the surface of the pixel portion 811 facing the counter substrate is provided so that each of red (R), green (G) and blue (B) color filters corresponds to each pixel. For practical display, color display is realized by color filters of three colors, i.e., a red color filter, a green color filter and a blue color filter. The arrangement of color filters of these three colors is arbitrary.

Figure 9A:
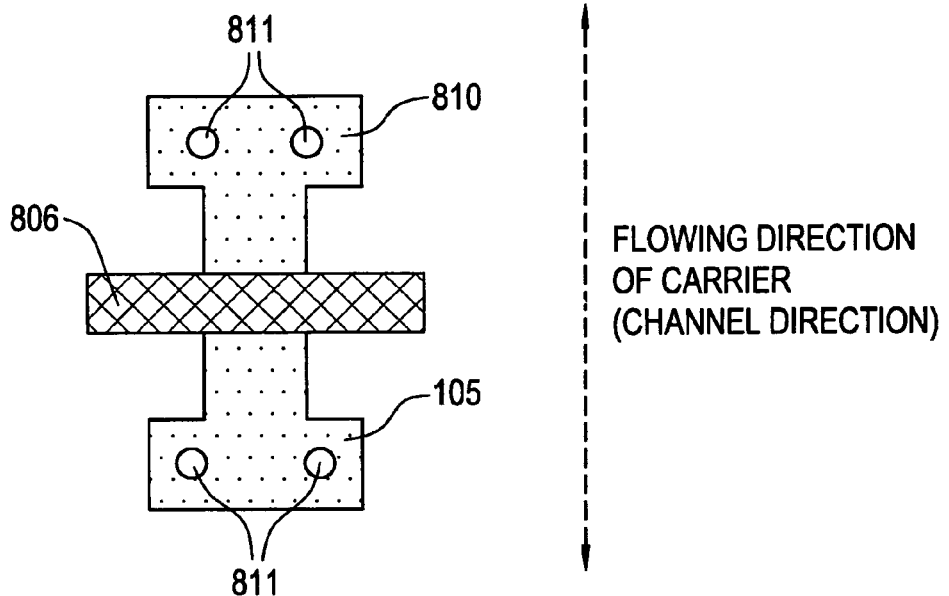
FIG. 9A is a schematic diagram of a TFT of a pixel section.
Figure 9B:
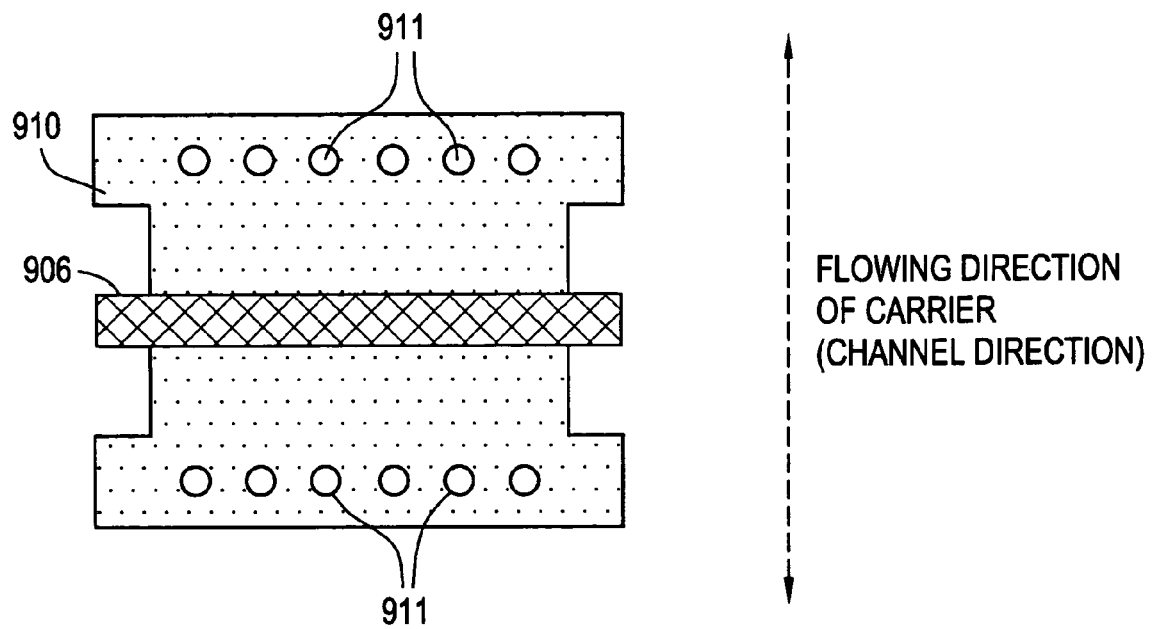
FIG. 9B is a schematic diagram of a TFT of a driving circuit.
Figure 10A:
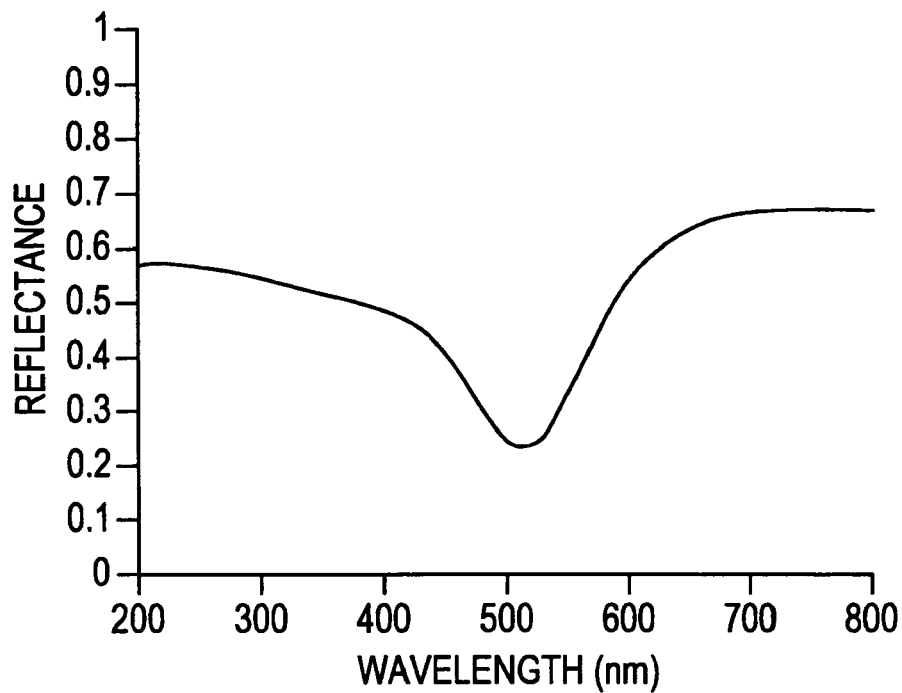
FIG. 10A is a graph showing the reflectance of an amorphous silicon film (thickness: 55 nm) relative to wavelength.
Figure 10B:
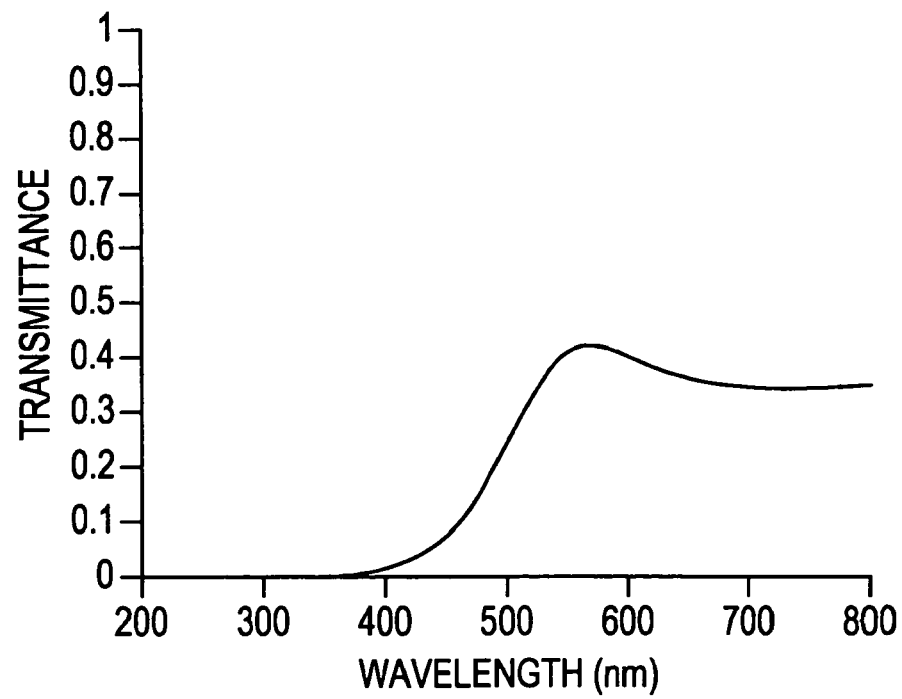
FIG. 10B is a graph showing the transmittance of the amorphous silicon film (thickness of 55 nm) relative to wavelength.

When the direction of grain growth caused by the irradiation of laser light (FIG. 8) is the same direction of arrow, if that direction and the flowing direction of carrier (channel direction) in a semiconductor layer 810 showed in FIG. 9A (Figure of TFT at pixel portion) are the same, electric mobility are not lowered. 806 indicate gate wiring and 811 indicates contact-hall. As the same way, if the direction of grain growth caused by the irradiation of laser light of FIG. 8 and the direction of carrier flow in semiconductor layer 910 showed in FIG. 9B (figure of TFT at driving circuit) are the same, electric mobility are not lowered. 906 indicate gate wiring and 911 indicates contact hall.

Embodiment 4

A laser annealer different from that in the first embodiment will be described. The laser annealer in this embodiment is characterized by providing a plurality of laser oscillators, a plurality of optical systems and a plurality of mirrors, condensing laser beams oscillated by the laser oscillators and processed by the optical systems, respectively and irradiating the condensed light beams to a substrate.

Figure 11:
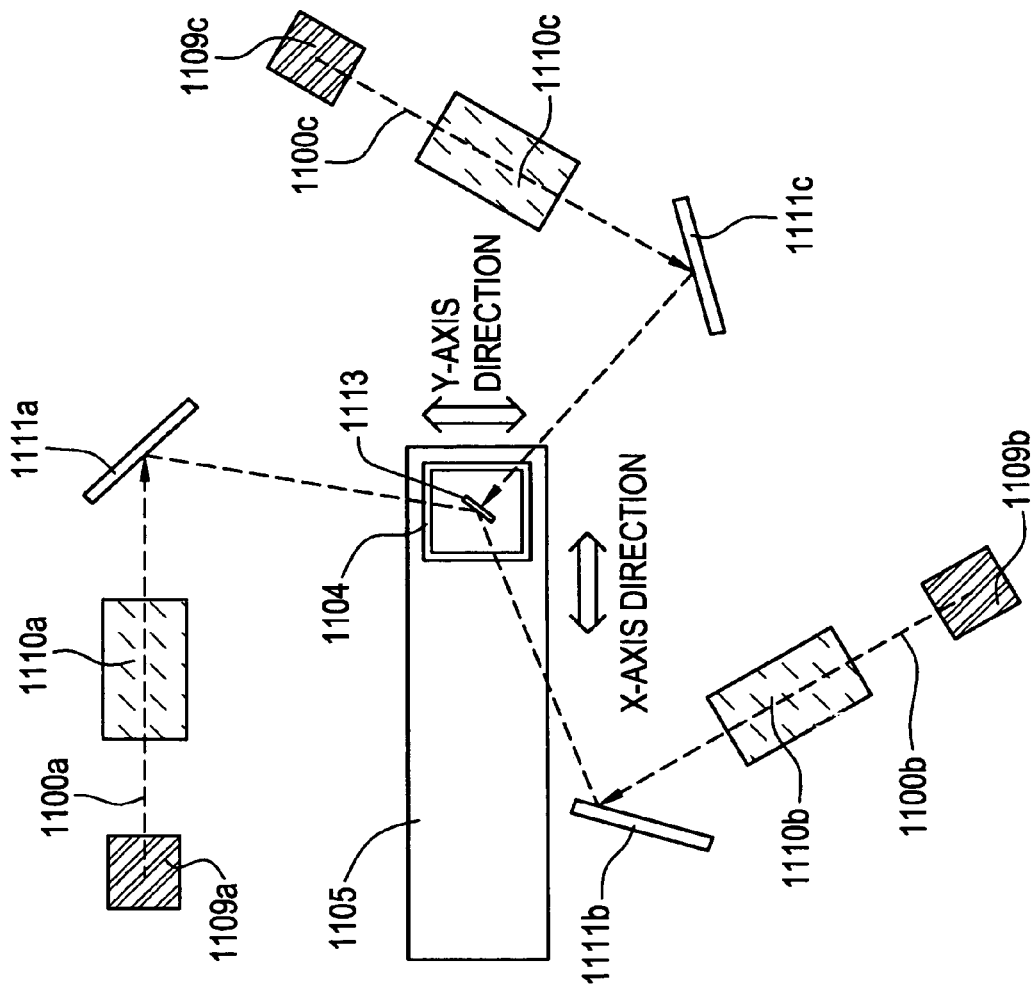
FIG. 11 is a view which shows an example of a laser annealer.

As shown in FIG. 11, laser beams 1100a to 1100c are emitted from laser oscillators 1109a to 1109c, processed by optical systems 1110a to 1110c, and reflected by mirrors 1111a to 1111c, respectively. The reflected laser beams are condensed and irradiated to a processing target substrate 1113 which is mounted on a stage 1104. Using a moving mechanism 1105 which is provided below the stage 1104, the processing target substrate 1113 can be moved in the X axis direction and the Y-axis direction. A ball, a barrel, a motor and the like may be provided below the moving mechanism 1105.

In this embodiment, it is possible to prevent or decrease the generation of a concentric pattern which has been disadvantageously generated by the irradiation of a laser beam or laser beams. It is, therefore, possible to improve the reliability of a resultant semiconductor device.

Embodiment 5

A laser annealer different from those in the first and second embodiments will be described. The laser annealer in this embodiment is characterized by providing a plurality of laser oscillators, a plurality of nonlinear optical elements and a waveguide, emitting laser beams from the respective laser oscillators, modulating the laser beams by the respective nonlinear optical elements, condensing the modulated laser beams by the waveguide and irradiating the condensed laser beams to a substrate.

As shown in FIG. 12, laser beams are emitted from laser oscillators 100a to 100c, the laser beams 112a to 112c modulated by nonlinear optical elements 101a to 101c are incident on a fiber array 103 and condensed by a waveguide 104. The laser beams emitted from a fiber array 105 are irradiated to a processing target substrate 113 on a stage 110. It is noted that the fiber array 103 is a means for making the laser beams 112a to 112c proximate to one another.

A stand 106 is provided below a stage 110 and a moving mechanism 107 is provided below the stand 106. Using the moving mechanism 107, the processing target substrate 113 can be moved in the X axis direction and the Y axis direction (not shown). A ball, a barrel, a motor and the like may be disposed below the moving mechanism 107.

In this embodiment, it is possible to prevent or decrease the generation of a concentric pattern which has been disadvantageously generated by the irradiation of a laser beam. It is, therefore, possible to improve the reliability of a resultant semiconductor device.

Embodiment 6

A laser annealer different from those in the first to third embodiments will be described, while particularly referring to an example of a moving mechanism for moving a stage with reference to FIG. 13.

Normally, a stage on which a processing target to be irradiated with a laser beam is mounted is moved along a guide rail which is provided in either the X axis direction or the Y axis direction. A curved object referred to as ball (bearing) is put between the guide rail and a section (slider) which fixes the stage. Therefore, a mechanism which can decrease load caused by friction and can smoothly move the stage is realized.

Since the ball (bearing) is worn by the repetitive movement of the stage, it is necessary to replace the ball by periodical maintenance. In addition, to move the stage more smoothly, it is necessary to decrease abrasion caused by the movement of the stage.

Figure 13A:
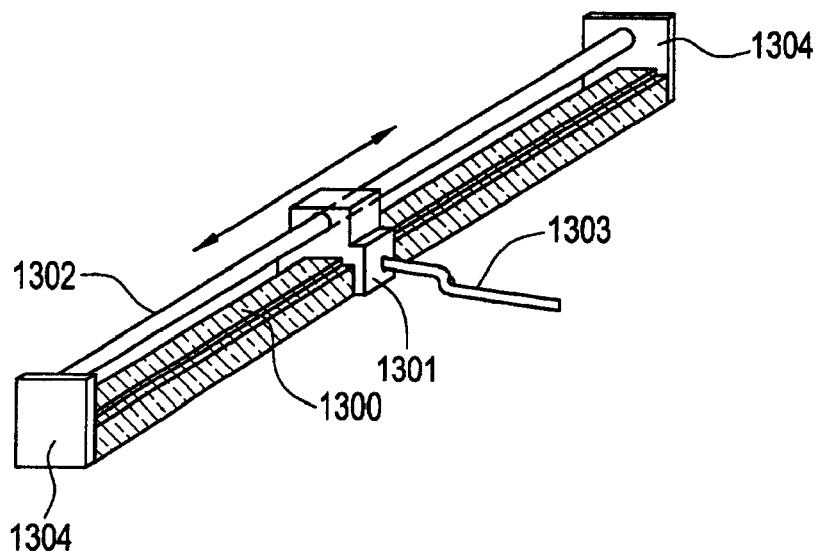
FIGS. 13A to 13C are views which show an example of a laser annealer.

A moving mechanism for moving the stage in this embodiment is shown in FIG. 13A. In FIG. 13A, reference symbol 1300 denotes a guide rail on which irregularities are formed in one direction to move the stage in a fixed direction. Reference symbol 1301 denotes a section, referred to as a slider, which fixes the stage. The slider 1301 can be moved along the guide rail 1300. Alternatively, a plurality of sliders may be provided to be fixed at predetermined intervals. A reference symbol 1302 denotes a rod which penetrates a hole formed in the slider 1301 and is provided in a direction along the guide rail 1300. The rod 1302 is fixed to the guide rail 1300 by an end plate 1304.

Figure 13B:
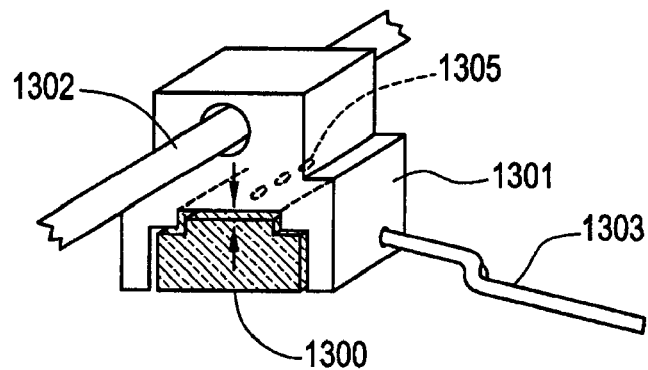

A power supply voltage and the air are fed to the slider 1301 through a cable 1303. FIG. 13B is an enlarged view of the slider 1301. A magnetic field which attracts the slider 1301 and the guide rail 1300 to each other is generated by the power supply voltage. In addition, a magnetic field in a direction in which the slider 1301 is away from and out of contact with the rod 1302 in the hole provided in the slider 1301, is generated by the power supply voltage. Using the principle of a linear motor force, the slider 1301 moves in a direction indicated by an arrow. On the other hand, a force acts on the slider 1301 and the guide rail 1300 so that the slider 1301 and the guide rail 1300 are attracted to each other by this magnetic field. The air fed to the slider 1300 is discharged to a region between the slider 1301 and the guide rail 1300 from an air hole 1305. Since a force acts in a direction in which the slider 1301 is away from rod 1302 by the attracting force of the magnetic field and the discharge of the air, a fixed distance is maintained between the slider 1301 and the guide rail 1300.

Alternatively, instead of generating magnetic field by the power supply voltage applied through the cable, one of the guide rail 1300 and the slider 1301 may be formed out of a magnetic member and the other one of the guide rail 1300 and the slider 1301 may be formed out of a material attracted by the magnetic member to thereby generate a magnetic field. Alternatively, the guide rail 1300 and the slider 1301 may be formed out of magnetic members, respectively.

Further, instead of generating the magnetic field by the power supply voltage applied through the cable, one of the rod 1302 and the slider 1301 may be formed out of a magnetic member and the other one of the rod 1302 and the slider 1301 may be formed out of a material which tends to be away from the magnetic member to thereby generate a magnetic field. Alternatively, the rod 1302 and the slider 1301 may be formed out of magnetic members, respectively.

Using the stage moving mechanism shown in this embodiment, it is possible to move the stage along the guide rail in a non-contact manner, to dispense with the regular replacement of the ball (bearing) and to thereby facilitate maintenance. In addition, because of the non-contact movement, abrasion hardly occurs and the stage can be moved more smoothly than a case where a ball is employed.

Figure 13C:
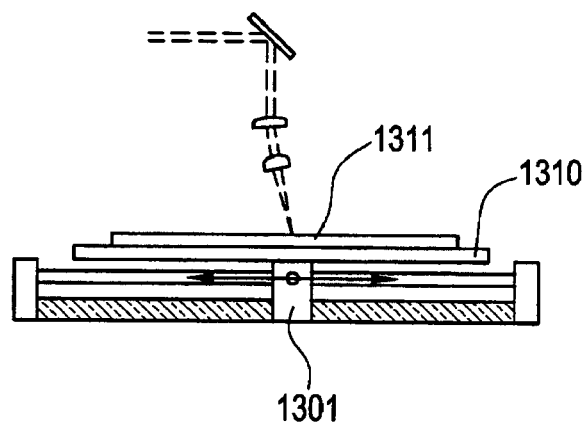

FIG. 13C shows a state in which a processing target 1311 to be irradiated with a laser beam is mounted on a stage 1310 fixed onto the slider 1301. In this embodiment; the stage moving means enables the stage to be moved more smoothly, making it possible to irradiate the laser beam to the processing target 1311 more uniformly.

As described so far, by employing the laser annealer according to the present invention, a plurality of laser beams are condensed to one laser flux to thereby prevent or decrease the generation of a concentric pattern, which has been disadvantageously generated by the irradiation of a laser flux and to make it possible to improve the reliability of a resultant semiconductor device. If the laser annealer according to the present invention is employed, it is possible to uniformly irradiate a laser beam or laser beams to even a semiconductor film on a large-sized substrate.

Further, according to the present invention, the laser beam is processed to have an elliptic cross section in the step using the laser annealing method to thereby improve throughput. Besides, by using a solid-state laser maintenance of which is easy, higher throughput than that by laser annealing employing a conventional excimer laser can be attained. Consequently, it is possible to decrease the manufacturing cost of a TFT and the semiconductor device such as a display formed out of the TFT.

Moreover, by irradiating the laser beam aslant to the semiconductor film, it is possible to remove or decrease the concentric pattern generated on the semiconductor film and to thereby make the material property of the semiconductor film after the step using the laser annealing method, uniform. If a semiconductor device is manufactured using such a semiconductor film, it is possible to greatly improve the performance of the semiconductor device.

What is claimed is:

1. A semiconductor device manufacturing method comprising:
   forming a semiconductor film over a substrate having an insulating surface;
   irradiating said semiconductor film with a laser beam aslant to said semiconductor film while moving said substrate at a constant rate in a first direction by moving a slider wherein the substrate is provided over the slider;
   moving said substrate in a second direction perpendicular to said first direction by a distance smaller than a width of said laser beam;
   irradiating said semiconductor film with said laser beam aslant to said semiconductor film while moving said substrate in a third direction parallel and opposite to said first direction; and
   moving said substrate in said second direction by a distance smaller than said width of said laser beam,
   wherein the slider is moved in a non-contact manner, and
   wherein said steps of irradiating said semiconductor film with said laser beam while moving said substrate in said first direction, moving said substrate in said second direction, irradiating said semiconductor film with said laser beam while moving said substrate in said third direction, and moving said substrate in said second direction are continuously repeated.

2. A method according to claim 1, wherein said constant rate falls within a range of 20 to 200 cm/s.

3. A method according to claim 1, wherein said laser beam is processed into elliptic shape on an irradiation surface.

4. A method according to claim 1, wherein an angle for irradiating said laser beam aslant to said semiconductor film is 5 to 10° with respect to a normal line direction of a front surface of said substrate or a normal line direction of a rear surface of said substrate.

5. A method according to claim 1, wherein crystallization of said semiconductor film is progressed in a direction parallel to said substrate and closer to an end face of said substrate.

6. A method according to claim 1, wherein said laser beam is irradiated to said semiconductor film from a rear surface side of said substrate.

7. A method according to claim 1, wherein said laser beam is a kind of second harmonics emitted from a laser selected from a group consisting of a Nd: YAG laser, an Nd: YLF laser, an Nd: $YVO_4$ laser and an Nd: $YAlO_3$ laser.

8. A method according to claim 1, wherein said laser beam is outputted at a power of not lower than 10 W.

9. A semiconductor device manufacturing method comprising:
   forming a semiconductor film over a substrate having an insulating surface;
   modulating said laser beam by a nonlinear optical element;
   condensing said modulated laser beam by causing said modulated laser beam to pass through a waveguide;
   irradiating said semiconductor film with said condensed laser beam aslant to said semiconductor film while moving said substrate at a constant rate in a first direction by moving a slider wherein the substrate is provided over the slider;
   moving said substrate in a second direction perpendicular to said first direction by a distance smaller than a width of said laser beam;
   irradiating said semiconductor film with said condensed laser beam aslant to said semiconductor film while moving said substrate in a third direction parallel and opposite to said first direction; and
   moving said substrate in said second direction by a distance smaller than said width of said laser beam,
   wherein the slider is moved in a non-contact manner, and
   wherein said steps of irradiating said semiconductor film with said condensed laser beam while moving said substrate in said first direction, moving said substrate in said second direction, irradiating said semiconductor film with said condensed laser beam while moving said substrate in said third direction, and moving said substrate in said second direction are continuously repeated.

10. A method according to claim 9, wherein said constant rate falls within a range of 20 to 200 cm/s.

11. A method according to claim 9, wherein said laser beam is processed into elliptic shape on an irradiation surface.

12. A method according to claim 9, wherein an angle for irradiating said laser beam aslant to said semiconductor film is 5 to 10° with respect to a normal line direction of a front surface of said substrate or a normal line direction of a rear surface of said substrate.

13. A method according to claim 9, wherein crystallization of said semiconductor film is progressed in a direction parallel to said substrate and closer to an end face of said substrate.

14. A method according to claim 9, wherein said laser beam is irradiated to said semiconductor film from a rear surface side of said substrate.

15. A method according to claim 9, wherein said laser beam is a kind of second harmonics emitted from a laser selected from a group consisting of a Nd: YAG laser, an Nd: YLF laser, an Nd: $YVO_4$ laser and an Nd: $YAlO_3$.

16. A method according to claim 9, wherein said laser beam is outputted at a power of not lower than 10 W.

17. A semiconductor device manufacturing method comprising:
   forming a semiconductor film over a substrate; and
   irradiating said semiconductor film with a laser beam aslant to said semiconductor film through a cylindrical lens having a focal length of 500 nm or more while moving said substrate at a constant rate in a first direction by moving a slider wherein the substrate is provided over the slider;
   moving said substrate in a second direction perpendicular to said first direction by a distance smaller than a width of said laser beam;
   irradiating said semiconductor film with said laser beam aslant to said semiconductor film while moving said substrate in a third direction parallel and opposite to said first direction; and
   moving said substrate in said second direction by a distance smaller than said width of said laser beam,
   wherein the slider is moved in a non-contact manner, and
   wherein said steps of irradiating said semiconductor film with said laser beam while moving said substrate in said first direction, moving said substrate in said second direction, irradiating said semiconductor film with said laser beam while moving said substrate in said third direction, and moving said substrate in said second direction are continuously repeated.

18. A method according to claim 17, wherein said constant rate falls within a range of 20 to 200 cm/s.

19. A method according to claim 17, wherein said laser beam is processed into elliptic shape on an irradiation surface.

20. A method according to claim 17, wherein an angle for irradiating said laser beam aslant to said semiconductor film is 5 to 10° with respect to a normal line direction of a front surface of said substrate or a normal line direction of a rear surface of said substrate.

21. A method according to claim 17, wherein crystallization of said semiconductor film is progressed in a direction parallel to said substrate and closer to an end face of said substrate.

22. A method according to claim 17, wherein said laser beam is irradiated to said semiconductor film from a rear surface side of said substrate.

23. A method according to claim 17, wherein said laser beam is a kind of second harmonics emitted from a laser selected from a group consisting of a Nd: YAG laser, an Nd: YLF laser, an Nd: $YVO_4$ laser and an Nd: $YAlO_3$ laser.

24. A method according to claim 17, wherein said laser beam is outputted at a power of not lower than 10 W.

25. A method according to claim 1, wherein said substrate is a glass substrate.

26. A method according to claim 9, wherein said substrate is a glass substrate.

27. A method according to claim 17, wherein said substrate is a glass substrate.

28. A method according to claim 1, further comprising:
   moving said substrate while being accelerated before irradiating said semiconductor layer; and
   moving said substrate while being decelerated after irradiating said semiconductor layer.

29. A method according to claim 9, further comprising:
   moving said substrate while being accelerated before irradiating said semiconductor layer; and
   moving said substrate while being decelerated after irradiating said semiconductor layer.

30. A method according to claim 17, further comprising:
   moving said substrate while being accelerated before irradiating said semiconductor layer; and
   moving said substrate while being decelerated after irradiating said semiconductor layer.

31. A method according to claim 1, wherein said laser beam is a CW laser beam.

32. A method according to claim 9, wherein said laser beam is a CW laser beam.

33. A method according to claim 17, wherein said laser beam is a CW laser beam.

34. A method according to claim 1, wherein the slider is moved by using a principle of a linear motor force.

35. A method according to claim 9, wherein the slider is moved by using a principle of a linear motor force.

36. A method according to claim 17, wherein the slider is moved by using a principle of a linear motor force.

* * * * *